(12) United States Patent
Harnefors

(10) Patent No.: US 10,170,914 B2
(45) Date of Patent: Jan. 1, 2019

(54) VOLTAGE SOURCE CONVERTER (VSC) CONTROL SYSTEM WITH ACTIVE DAMPING

(71) Applicant: ABB SCHWEIZ AG, Baden (CH)

(72) Inventor: Lennart Harnefors, Eskilstuna (SE)

(73) Assignee: ABB SCHWEIZ AG, Baden (CH)

( * ) Notice: Subject to any disclaimer, the term of this patent is extended or adjusted under 35 U.S.C. 154(b) by 0 days.

(21) Appl. No.: 15/756,914

(22) PCT Filed: Sep. 1, 2015

(86) PCT No.: PCT/EP2015/069960
§ 371 (c)(1),
(2) Date: Mar. 1, 2018

(87) PCT Pub. No.: WO2017/036517
PCT Pub. Date: Mar. 9, 2017

(65) Prior Publication Data
US 2018/0278058 A1 Sep. 27, 2018

(51) Int. Cl.
| | |
|---|---|
| *H02M 1/12* | (2006.01) |
| *H02J 3/01* | (2006.01) |
| *H02J 3/24* | (2006.01) |
| *H02M 5/257* | (2006.01) |
| *G05B 19/02* | (2006.01) |
| *H03L 7/08* | (2006.01) |

(52) U.S. Cl.
CPC ............... *H02J 3/24* (2013.01); *H02M 5/257* (2013.01); *G05B 19/02* (2013.01); *H03L 7/08* (2013.01)

(58) Field of Classification Search
CPC .......... H02M 1/08; H02M 1/12; H02M 1/126; H02M 1/14; H02M 1/143; H02M 1/15; H02M 1/44; H02J 3/01; H02J 3/24; H03L 7/06; H03L 7/07; H03L 7/08
See application file for complete search history.

(56) References Cited

U.S. PATENT DOCUMENTS

| | | | |
|---|---|---|---|
| 5,513,090 A | 4/1996 | Bhattacharya et al. | |
| 7,450,405 B2* | 11/2008 | Ponnaluri ............... | H02M 1/12 363/40 |
| 9,705,331 B2* | 7/2017 | Khajehoddin ........ | H02J 3/1842 |
| 2012/0063179 A1* | 3/2012 | Gong ...................... | H02M 1/12 363/40 |

(Continued)

OTHER PUBLICATIONS

Alawasa et al., "Modeling, Analysis, and Suppression of the Impact of Full-Scale Wind-Power Converters on Subsynchronous Damping", IEEE Systems Journal, vol. 7, No. 4, Dec. 2013, pp. 700-712.

(Continued)

*Primary Examiner* — Gary L Laxton
(74) *Attorney, Agent, or Firm* — Birch, Stewart, Kolasch & Birch, LLP

(57) ABSTRACT

A Voltage Source Converter control system for active damping of a resonance oscillation in the VSC includes a regular Phase-Locked Loop 2, and a slow PLL 3. The control system is arranged such that an imaginary part of the AD is obtainable from the slow PLL. The slow PLL is configured for having a closed-loop bandwidth which is less than a frequency, in a synchronous dq frame, of the resonance oscillation to be dampened.

20 Claims, 3 Drawing Sheets

(56) References Cited

U.S. PATENT DOCUMENTS

2014/0032000 A1   1/2014   Chandrashekhara et al.

OTHER PUBLICATIONS

Harnefors et al., "Input-Admittance Calculation and Shaping for Controlled Voltage-Source Converters", IEEE Transactions on Industrial Electronics, vol. 54, No. 6, Dec. 2007, pp. 3323-3334.
International Preliminary Report on Patentability, issued in PCT/EP2015/069960, dated Dec. 12, 2017.
International Search Report issued in PCT/EP2015/069960 (PCT/ISA/210), dated Apr. 6, 2016.
Written Opinion of the International Searching Authority issued in PCT/EP2015/069960 (PCT/ISA/237), dated Apr. 6, 2016.

* cited by examiner

VOLTAGE SOURCE CONVERTER (VSC) CONTROL SYSTEM WITH ACTIVE DAMPING

TECHNICAL FIELD

The present disclosure relates to a Voltage Source Converter (VSC) control system for active damping (AD) of a resonance oscillation in the VSC.

BACKGROUND

A voltage-source converter (VSC) of high enough power rating may cause destabilization of grid resonances in the vicinity of the synchronous (fundamental) frequency $f_1$. Of particular concern are subsynchronous torsional resonances. A torsional resonant frequency $f_r$ in the range of tens of hertz (Hz) is mirrored to the frequency $f_1 - f_r$ in the three-phase domain (as well as in the equivalent two-phase domain domain). It thus remains subsynchronous, i.e., it appears below the synchronous frequency. Often, the inherent damping of the system is sufficient to avoid resonance destabilization, but in some cases subsynchronous damping controllers are needed. In weak grids, the lowest electrical grid resonance may be close to, but above, the synchronous frequency, i.e., it is supersynchronous. Also in this case, destabilization may occur.

By "near-synchronous" we here imply a resonant frequency that may be subsynchronous or supersynchronous, but in the latter case typically not larger than $2f_1$.

A subsynchronous damping scheme, shown in FIG. 3, has been proposed by K. M. Alawasa, Y. A.-R. I. Mohamed, and W. Xu, in "Active mitigation of subsynchronous interactions between PWM voltage-source converters and power networks", IEEE Trans. Power Electron., vol. 29, no. 1, pp. 121-134, January 2014. The damping scheme comprises a phase-locked loop (PLL) and is effective for damping of torsional resonances.

SUMMARY

The damping scheme proposed by Alawasa et al., mentioned above, is shown to have a drawback in that negative impact of the phase-locked loop (PLL) results. An objective of the present invention is to present an improved VSC control system which reduces or eliminates this negative impact. Stable operation is shown by simulation. The invention may be used for High-Voltage Direct Current (HVDC) applications, but also other power applications are contemplated such as Flexible Alternating Current Transmission System (FACTS) and medium-voltage drive applications.

According to an aspect of the present invention, there is provided a Voltage Source Converter (VSC) control system for active damping (AD) of a resonance oscillation in the VSC. The control system comprises a regular Phase-Locked Loop (PLL), as well as a slow PLL. The control system is arranged such that an imaginary part in the synchronous dq frame of the AD is obtainable from the slow PLL. The slow PLL is configured for having a closed-loop bandwidth which is less than a frequency, in a synchronous dq frame (i.e. a coordinate system with real and imaginary axii), of the resonance oscillation to be dampened.

It is to be noted that any feature of any of the aspects may be applied to any other aspect, wherever appropriate. Likewise, any advantage of any of the aspects may apply to any of the other aspects. Other objectives, features and advantages of the enclosed embodiments will be apparent from the following detailed disclosure, from the attached dependent claims as well as from the drawings.

Generally, all terms used in the claims are to be interpreted according to their ordinary meaning in the technical field, unless explicitly defined otherwise herein. All references to "a/an/the element, apparatus, component, means, step, etc." are to be interpreted openly as referring to at least one instance of the element, apparatus, component, means, step, etc., unless explicitly stated otherwise. The steps of any method disclosed herein do not have to be performed in the exact order disclosed, unless explicitly stated. The use of "first", "second" etc. for different features/components of the present disclosure are only intended to distinguish the features/components from other similar features/components and not to impart any order or hierarchy to the features/components.

BRIEF DESCRIPTION OF THE DRAWINGS

Embodiments will be described, by way of example, with reference to the accompanying drawings, in which.

DETAILED DESCRIPTION

Embodiments will now be described more fully hereinafter with reference to the accompanying drawings, in which certain embodiments are shown. However, other embodiments in many different forms are possible within the scope of the present disclosure. Rather, the following embodiments are provided by way of example so that this disclosure will be thorough and complete, and will fully convey the scope of the disclosure to those skilled in the art. Like numbers refer to like elements throughout the description.

Figure 1:
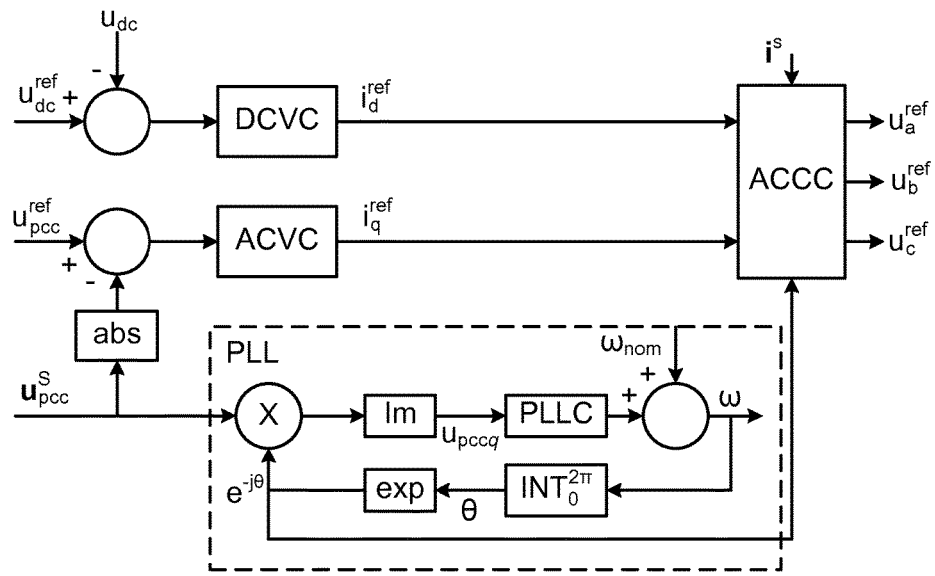
FIG. 1 is a schematic circuit diagram of a standard VSC control system.

The cause of resonance destabilization is negative-resistance behaviour resulting from the various cascaded and parallel controllers that make up the VSC control system. A typical control system is depicted in FIG. 1, where the PLL is illustrated within the dashed line, boldface letters denote complex space vectors and the superscript "s" denotes the stationary $\alpha\beta$ reference frame. The controllers work as follows:

The Direct Current (DC or dc) voltage controller (DCVC) operates on the error between the dc-voltage reference $u_{dc}^{ref}$ and the actual dc voltage $u_{dc}$. Its output is the active-power-producing current reference $i_d^{ref}$. Reference $u_{dc}^{ref}$ may be adjusted by an outer active-power controller in a cascaded fashion.

The ac-voltage controller (ACVC) operates on the error between the point-of-common-coupling (PCC)-voltage reference $u_{pcc}^{ref}$ and the actual PCC-voltage modulus $u_{pcc} = |u_{pcc}^s|$. Its output is the reactive-power-producing current reference $i_q$. Reference up, may be adjusted by an outer reactive-power controller in a cascaded fashion.

Both current references are fed to the ac-current controller (ACCC), whose outputs are the VSC phase-voltage references $u_{a,b,c}^{ref}$, which form the input to the pulse width modulator. The ACCC may be implemented in the αβ frame or in the synchronous dq frame. The ACCC has as input signals also the converter input current $i^s$ and the transformation angle θ (or the exponential factors $e^{\pm j\theta}$ thereof).

The transformation angle θ is computed by the phase-locked loop (PLL), whose input $u_{pccq}$ is the imaginary part of the dq-transformed PCC voltage $u_{pcc} = e^{-j\theta} u_{pcc}{}^s$. Input $u_{pccq}$ is fed to the PLL controller (PLLC), to whose output the nominal angular synchronous frequency $\omega_{nom}$ is added, forming the instantaneous angular frequency co. This is then integrated into the transformation angle θ (modulo 2π).

All the mentioned controllers are normally of proportional-integral (PI) type.

Figure 2:
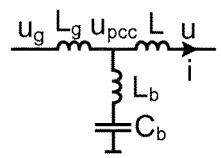
FIG. 2 is a schematic illustration of a main-circuit model.

To test the damping scheme proposed by Alawasa et al., a test system is implemented in Matlab, using a per-unit (pu) system. The base frequency is set to the synchronous frequency 50 Hz, but all other base values are unspecified. The main circuit is as shown in FIG. 2. An LC series resonance (comprising an inductor L and a capacitor C), with resonant frequency $f_{res}=1/(2\pi\sqrt{L_bC_b})$, is inserted as a branch at the PCC. L is the phase-reactor-plus-transformer inductance and Lg is the grid inductance in front of the stiff grid voltage $v_g$. The inductances are selected as L=Lg=0.1 pu and Lb=1 pu. The closed-loop bandwidths of the respective control loops are chosen as ACCC: 4 pu, PLL: 1 pu, and DCVC: 0.5 pu. The ACVC proportional gain it set to 1 pu. Integral action is added to all controllers. The ACCC is implemented in the αβ frame, implying that a generalized integrator (i.e., a resonator at the synchronous frequency) is used.

Three cases are evaluated, all for inverter operation at 0.9 pu active power, but with different LC resonant frequencies. Relatively well-damped operation is obtained for $f_{res}=2f_1$, poorly damped operation for $f_{res}=1.5 f_1$, and unstable operation for $f_{res}=1.3f_1$.

As mentioned above, to mitigate subsynchronous torsional interaction, damping controllers can be added to the VSC control system. Two interesting damping schemes (and their combination) are proposed by Alawasa et al.

The rationale behind the first scheme is to inject a contribution to the current reference vector $i_{ref}=i_d^{ref}ji_g^{ref}$, where j is the square root of −1, as $$i_{ref}^{modified} = i_{ref} + B(s)u_{pcc} \quad (1)$$

where B(s) (s=d/dt) is a bandpass filter. The scheme can be generalized (enhanced) as shown in FIG. 3, where the active damper (AD) operates on the difference between $u_{pcc}$ and its reference as $$i_{ref}^{modified} = i_{ref} + AD(u_{pcc} - u_{pcc}^{ref}). \quad (2)$$

The AD can now, theoretically, be a proportional gain $G_a$, which acts as an active conductance $$i_{ref}^{modified} = i_{ref} + G_a(u_{pcc} - u_{pcc}^{ref}). \quad (3)$$

In practice, however, a low-pass filter may be added to suppress disturbances of higher frequencies. A hard limiter may also be added to avoid large transient injections.

Figure 3:
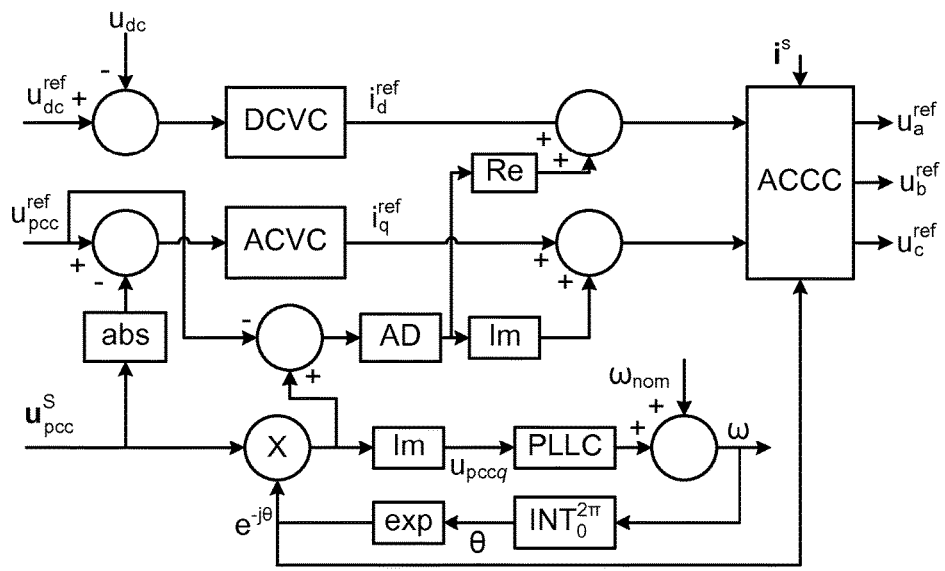
FIG. 3 is a schematic circuit diagram of a VSC control system with AD according to prior art.

The scheme proposed by Alawasa et al. in accordance with FIG. 3 is shown to give improved damping at subsynchronous frequencies. However, it often fails to stabilize a resonance close to, but above, the synchronous frequency, as will now be shown. We set $G_a=4$ pu and obtain results in which the amplitudes of the oscillations in response to a step change no longer appear to grow over time for $f_{res}=1.3 f_1$, but the system is only marginally stable. Increasing $G_a$ does not give improved stability.

The proposed scheme of Alawasa et al. manages to add damping that compensates negative impact of the ACVC and the DCVC, but negative impact of the PLL actually increases. This can be understood as follows. Let us consider a scenario when the system is in the steady state, but oscillations of small amplitudes start to occur. These are modelled as incremental variables, denoted with the prefix A. For the PCC voltage, we thus have $$u_{pcc}{}^s = e^{j\omega_1 t}(u_{pcc}{}^{ref} + \Delta u_{pccd} + j\Delta u_{pccq}). \quad (4)$$

and for the transformation angle $$\theta = \omega_1 t + \Delta\theta. \quad (5)$$

Now, the dq transformation of the PCC voltage is given by $$u_{pcc} = e^{-j\theta} u_{pcc}{}^s = e^{-j(\omega_1 t+\Delta\theta)} e^{j\omega_1 t}(u_{pcc}{}^{ref} + \Delta u_{pccd} + j\Delta u_{pccq}). \quad (6)$$

Since Δθ is small, $e^{-j\theta} \approx 1-j\Delta\theta$, giving $$u_{pcc} \approx (1-j\Delta\theta)(u_{pcc}{}^{ref} + \Delta u_{pccd} + j\Delta u_{pccq}). \quad (7)$$

Neglecting cross products of Δ quantities yields $$u_{pcc} \approx u_{pcc}{}^{ref} + \Delta u_{pccd} + j(\Delta u_{pccq} - u_{pcc}{}^{ref}\Delta\theta) \quad (8)$$

and $$u_{pcc} - u_{pcc}{}^{ref} = \Delta u_{pccd} + j(\Delta u_{pccq} - u_{pcc}{}^{ref}\Delta\theta). \quad (9)$$

This shows that the correct d component, $\Delta u_{pccd}$, of the error $u_{pcc} - u_{pcc}{}^{ref}$ is obtained, whereas in the q component a parasitic contribution is added: the term proportional to Δθ. This term is the reason for negative impact of the PLL in the scheme shown in FIG. 3.

Figure 4:
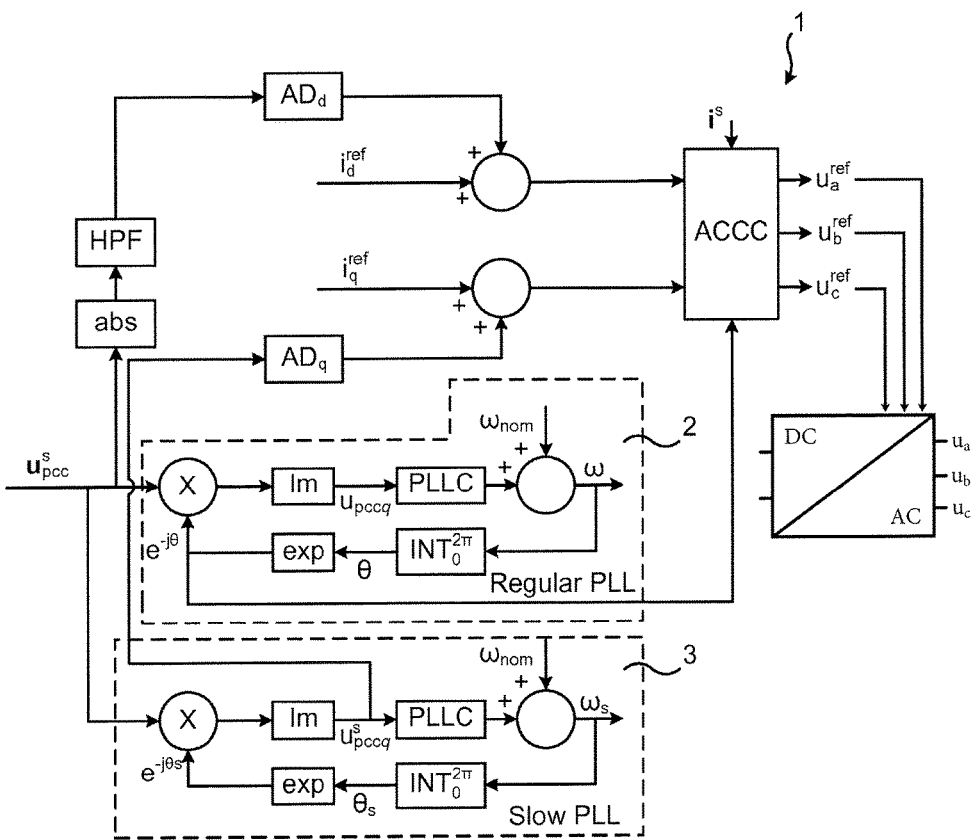
FIG. 4 is a schematic circuit diagram of an embodiment of a VSC control system with AD according to the present invention.
Figure 5:
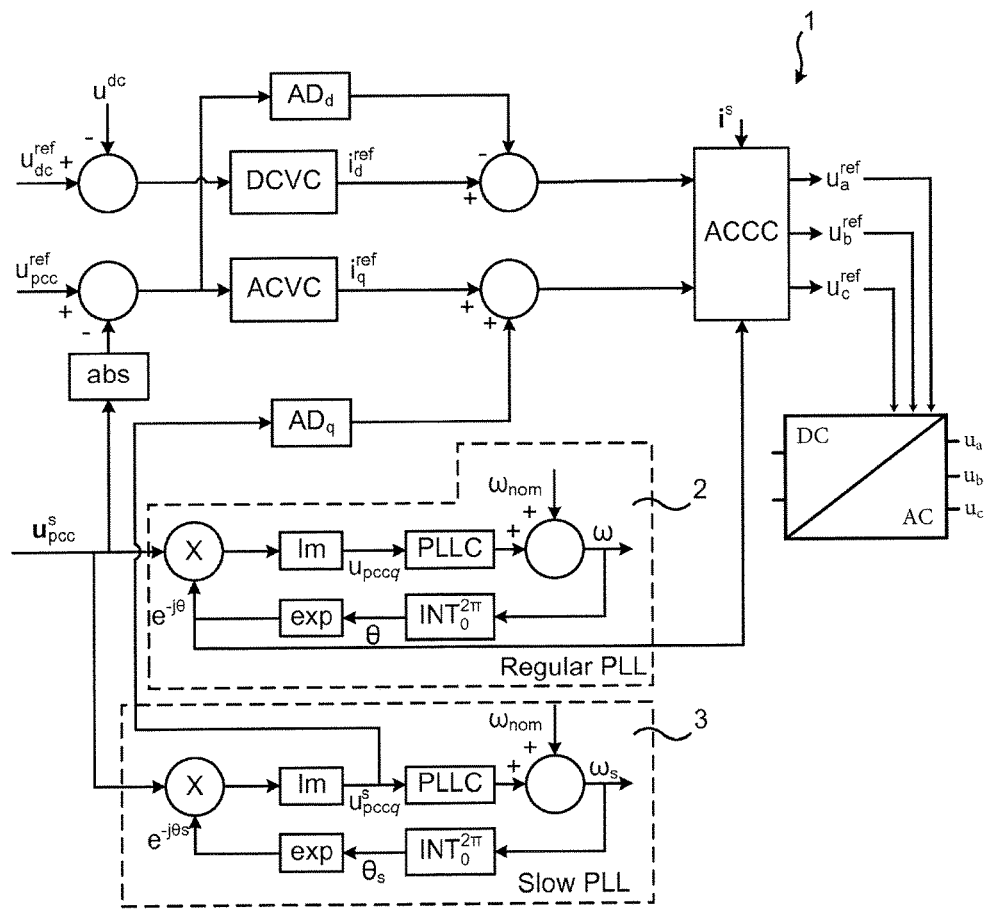
FIG. 5 is a schematic circuit diagram of another embodiment of a VSC control system with AD according to the present invention.

The negative PLL impact found in (9) can be reduced to a minimum by modifying the control scheme to the schemes 1 shown in FIGS. 4 and 5. According to FIG. 5, the d part of the active damping (ADO) is obtained by tapping the input signal to the ACVC. This gives the correct signal (after a sign change), because the modulus of (4) with $u_{pcc}{}^{ref}$ subtracted is given by $$|u_{pcc}^s| - u_{pcc}^{ref} = |u_{pcc}^{ref} + \Delta u_{pccd} + j\Delta u_{pccq}| - u_{pcc}^{ref} = \quad (10)$$

$$\sqrt{(u_{pcc}^{ref} + \Delta u_{pccd})^2 + \Delta u_{pccq}^2} - u_{pcc}^{ref} =$$

$$u_{pcc}^{ref}\sqrt{1 + \frac{2\Delta u_{pccd}}{u_{pcc}^{ref}} + \left(\frac{\Delta u_{pccd}}{u_{pcc}^{ref}}\right)^2 + \left(\frac{\Delta u_{pccq}}{u_{pcc}^{ref}}\right)^2} - u_{pcc}^{ref} \approx$$

$$u_{pcc}^{ref}\sqrt{1 + \frac{2\Delta u_{pccd}}{u_{pcc}^{ref}}} - u_{pcc}^{ref} \approx \Delta u_{pccd}.$$

The q part of the active damping ($AD_q$) is obtained by tapping the input signal $u_{pccq}{}^s$ to an added slow PLL 3 (denoted with the sub- or superscript "s"). The gain of the slow PLL controller ($PLLC_s$) shall be significantly lower than that of the regular PLL 2 (PLLC).

The slow PLL 3 should have a bandwidth which is less than the frequency, as referred to the synchronous dq frame, of the oscillations to be dampened. Thus, the slow PLL 3 is slower, is running at a lower frequency, than the oscillations to be dampened such that Os (the angle tracking $u_{pcc}{}^s$) does not include said oscillations.

For example, in some embodiments, the slow PLL 3 may be configured for having a closed-loop bandwidth which is a fraction of the closed-loop bandwidth of the regular PLL 2, e.g. in the range of ⅕ to 1/20 of the closed-loop bandwidth of the regular PLL.

In some embodiments, the slow PLL 3 may be configured for having a closed-loop bandwidth which is less than 100, such as less than 50, radians per second, e.g. in the range of 5 to 40 or 5 to 20 radians per second.

PLLC$_s$ shall preferably not have an integral part. AD$_d$ and AD$_q$ may be low-pass filters with equal or different gains, possibly with hard limiters added.

It is not a necessity to include ac- and dc-voltage controllers, DCVC and ACVC in FIG. 5. As long as the regular (fast) PLL 2 is used, the active damping contribution in the q direction may be added without modification. For the d direction contribution, a substitute for the reference $u_{pcc}^{ref}$, may be found, e.g. by means of a high-pass filter (HPF) $|_{pcc}^s|$, as shown in FIG. 4. Consider (4) with $u_{pcc}^{ref}=U_{pcc}$, we get $$|u_{pcc}^s| = |U_{pcc} + \Delta u_{pccd} + j\Delta u_{pccq}| = \sqrt{(U_{pcc} + \Delta u_{pccd})^2 + \Delta u_{pccq}^2} = \qquad (11)$$

$$U_{pcc}\sqrt{1 + \frac{2U_{pcc}\Delta u_{pccd} + \Delta u_{pccd}^2 + \Delta u_{pccq}^2}{U_{pcc}^2}} \approx$$

$$U_{pcc}\left(1 + \frac{1}{2}\frac{2U_{pcc}\Delta u_{pccd} + \Delta u_{pccd}^2 + \Delta u_{pccq}^2}{U_{pcc}^2}\right) \approx U_{pcc} + \Delta u_{pccd}.$$

If the cut-off frequency of the high-pass filter is set lower than the frequency (as referred to the dq frame) of the oscillation that is to be damped, then the oscillating component $\Delta u_{pccd}$ passes through, whereas the mean value $U_{pcc}$ is rejected:

$$\mathrm{HPF}(|u_{pcc}^s|) \approx \mathrm{HPF}(U_{pcc}+\Delta u_{pccd})=u_{pccd}. \qquad (12)$$

The regular PLL 2 is still used to translate θ to the dq coordinate system. It may form its input signal as follows. Suppose that $u_{pcc}^s = U_{pcc}e^{j\omega 1}$. Then $$u_{pccq}=\mathrm{Im}\{e^{-j\omega}u_{pcc}^s\}=U_{pcc}\mathrm{Im}\{e^{j(\theta 1-\theta)}\}=U_{pcc}\sin(\theta_1-\theta). \qquad (13)$$

The closed loop formed around the PLL controller forces θ to converge to θ1, such that $u_{pccq}=0$ in the steady state. This is why active damping with $u_{pccq}$ tapped from the regular PLL 2 may fail. The oscillations that are to be damped are suppressed in $u_{pccq}$, since the regular PLL 2 may have too fast tracking in relation to the oscillation frequency. Slowing down the regular PLL would degrade the dynamic properties of the control system (such as the response in the ac- and dc-voltage control) and is not an option. This is why the slow PLL 3 has been added. The closed-loop bandwidth of the slow PLL 3 should be lower than the frequency (as referred to the dq frame) of the oscillation that is to be damped.

If the bandwidth of the slow PLL 3 is set to 0.02 pu and the same "active conductance" $G_a=4$ pu is used in both AD$_d$ and AD$_q$. The new active damping scheme is evaluated for $f_{res}=1.3\ f_1$, giving a significantly improved damping compared with the scheme of Alawasa et al.

The damping method of the present invention may be straight-forward to implement in existing e.g. HVDC control systems. It offers the potential of resistance to detrimental subsynchronous torsional interaction, regardless of the torsional frequencies. It may also be conjectured that stable operation using current control mode may be possible even for very weak grids.

The present disclosure has mainly been described above with reference to a few embodiments. However, as is readily appreciated by a person skilled in the art, other embodiments than the ones disclosed above are equally possible within the scope of the present disclosure, as defined by the appended claims.

The invention claimed is:

1. A Voltage Source Converter control system for active damping of a resonance oscillation in a Voltage Source Converter (VSC), the resonance oscillation having a frequency which is above a synchronous frequency but less than two times said synchronous frequency, the control system comprising:
    a first Phase-Locked Loop (PLL) having a first PLL controller; and
    a second PLL having a second PLL controller, the second PLL controller having a gain which is lower than a gain of the first PLL controller,
    wherein the control system is arranged such that an imaginary part of an active damping signal is obtainable from the second PLL; and
    wherein the second PLL is configured for having a closed-loop bandwidth which is less than the frequency of the resonance oscillation to be dampened in a synchronous dq frame.

2. The control system of claim 1, wherein the closed-loop bandwidth of the second PLL is configured to be less than 100 radians per second.

3. The control system of claim 1, wherein the closed-loop bandwidth of the second PLL is configured to be a fraction of a closed-loop bandwidth of the first PLL.

4. The control system of claim 1, wherein the control system is arranged such that a real part of the active damping signal is obtainable via a High-Pass Filter of the control system.

5. The control system of claim 1, wherein the control system is arranged such that a real part of the active damping signal is obtainable by tapping an input signal to an Alternating Current Voltage Control of the control system.

6. The control system of claim 1, wherein the frequency of the resonance oscillation is within the range of 1.3 to 2 times the synchronous frequency.

7. The control system of claim 1, wherein the frequency of the resonance oscillation is 1.3 times the synchronous frequency.

8. The control system of claim 1, wherein the frequency of the resonance oscillation is 1.5 times the synchronous frequency.

9. The control system of claim 2, wherein the closed-loop bandwidth of the second PLL is configured to be a fraction of a closed-loop bandwidth of the first PLL.

10. The control system of claim 2, wherein the control system is arranged such that a real part of the active damping signal is obtainable via a High-Pass Filter of the control system.

11. The control system of claim 3, wherein the control system is arranged such that a real part of the active damping signal is obtainable via a High-Pass Filter of the control system.

12. The control system of claim 2, wherein the control system is arranged such that a real part of the active damping signal is obtainable by tapping an input signal to an Alternating Current Voltage Control of the control system.

13. The control system of claim 3, wherein the control system is arranged such that a real part of the active damping signal is obtainable by tapping an input signal to an Alternating Current Voltage Control of the control system.

14. The control system of claim 2, wherein the frequency of the resonance oscillation is within the range of 1.3 to 2 times the synchronous frequency.

15. The control system of claim 3, wherein the frequency of the resonance oscillation is within the range of 1.3 to 2 times the synchronous frequency.

16. The control system of claim 4, wherein the frequency of the resonance oscillation is within the range of 1.3 to 2 times the synchronous frequency.

17. The control system of claim 5, wherein the frequency of the resonance oscillation is within the range of 1.3 to 2 times the synchronous frequency.

18. The control system of claim 2, wherein the frequency of the resonance oscillation is 1.3 times the synchronous frequency.

19. The control system of claim 3, wherein the frequency of the resonance oscillation is 1.3 times the synchronous frequency.

20. A method of active damping of a resonance oscillation in a Voltage Source Converter (VSC) by a VSC control system, the resonance oscillation having a frequency which is above a synchronous frequency but less than two times said synchronous frequency, wherein the control system comprises:
- a first Phase-Locked Loop (PLL) having a first PLL controller, and
- a second PLL having a second PLL controller, the second PLL controller having a gain which is lower than a gain of the first PLL controller,
- wherein the control system obtains an imaginary part of an active damping signal from the second PLL; and
- wherein the second PLL has a closed-loop bandwidth which is less than the frequency of the resonance oscillation being dampened in a synchronous dq frame.

* * * * *